United States Patent [19]
Sakai

[11] Patent Number: 5,223,786
[45] Date of Patent: Jun. 29, 1993

[54] BURN-IN DEVICE

[75] Inventor: Iwao Sakai, Itami, Japan

[73] Assignee: Mitsubishi Denki Kabushiki Kaisha, Tokyo, Japan

[21] Appl. No.: 775,527

[22] Filed: Oct. 15, 1991

[30] Foreign Application Priority Data

Jan. 8, 1991 [JP] Japan .................................. 3-011542

[51] Int. Cl.[5] ...................... G01R 31/28; G01R 31/02
[52] U.S. Cl. .................................. 324/158 F; 361/413
[58] Field of Search .............. 324/158 R, 73.1, 158 F, 324/158 P; 361/393, 412, 413, 415, 400, 401

[56] References Cited

U.S. PATENT DOCUMENTS

| 4,542,341 | 9/1985 | Santomango et al. | 324/158 F |
|---|---|---|---|
| 4,636,725 | 1/1987 | Santomango et al. | 324/158 F |
| 4,949,035 | 8/1990 | Palmer, II | 324/158 R |
| 5,093,982 | 3/1992 | Gussman | 324/158 F |

Primary Examiner—Vinh Nguyen
Attorney, Agent, or Firm—Leydig, Voit & Mayer

[57] ABSTRACT

Different types of a plurality of connectors are provided on a plurality of stages of one slot. Burn-in boards are arranged in a carried in accordance with the positions of the connectors which are in conformity with the burn-in boards. Thus, a burn-in test can be conducted for burn-in boards with one burn-in device, even when the size of the burn-in board and the shape of the connector are different.

2 Claims, 3 Drawing Sheets

FIG. I

BURN-IN DEVICE

BACKGROUND OF THE INVENTION

1. Field of the Invention

The present invention relates to a burn-in device with which a burn-in test for semiconductor chips is conducted.

2. Description of the Related Art

FIG. 4 is a schematic front view showing the state in which burn-in boards are inserted into a carrier of a conventional burn-in device, and FIG. 5 is a schematic plan view showing how these burn-in boards are connected. As shown in these drawings, a plurality of burn-in boards 1, each of which is retained by rail-like support members 2, are accommodated in a burn-in board carrier 3. One burn-in board 1, upheld by the support members 2, on a unit stage is regarded as one slot. Each of the burn-in boards 1 is connected through a connector 4 to a group of burn-in test drivers 5 which are installed in a burn-in device (not shown).

The conventional burn-in device is constructed as described above. The burn-in boards 1 are accommodated in the burn-in board carrier 3, and then are inserted into the connectors 4 inside a burn-in chamber (not shown) which is mounted in the burn-in device (not shown). Thereafter signal waveforms are input through the drivers 5 to perform a burn-in test.

There is a problem in that one burn-in device as mentioned above allows a burn-in test for only burn-in boards having the same shape. Therefore when the size of the burn-in board 1 and the shape of the connector 4 are different, a burn-in test cannot be carried out.

SUMMARY OF THE INVENTION

The present invention has been made in view of such a problem. Accordingly, the object of the invention is to provide a burn-in device with which a burn-in test can be performed for various types of burn-in boards, even when the size of the burn-in board and the shape of a connector are different.

In order to achieve the above object, according to one aspect of the invention, there is provided a burn-in device comprising: different types of a plurality of connectors, for one slot, which are arranged in a plurality of rows on a plurality of stages; drivers for transmitting an electrical signal to the connectors; a plurality of types of burn-in boards; and burn-in board carriers for accommodating the burn-in boards so that the burn-in boards may be connected to the connectors which correspond to the burn-in boards.

DESCRIPTION OF THE PREFERRED EMBODIMENT

Figure 1:
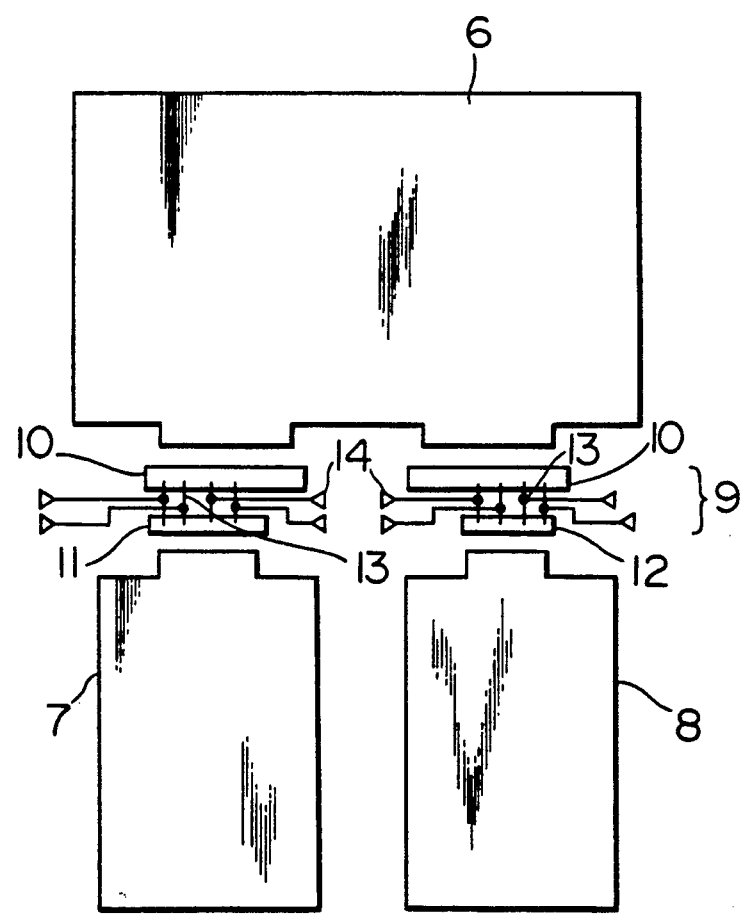
FIG. 1 is a schematic plan view showing the state in which burn-in boards are inserted into a burn-in device in accordance with an embodiment of the present invention.
Figure 2:
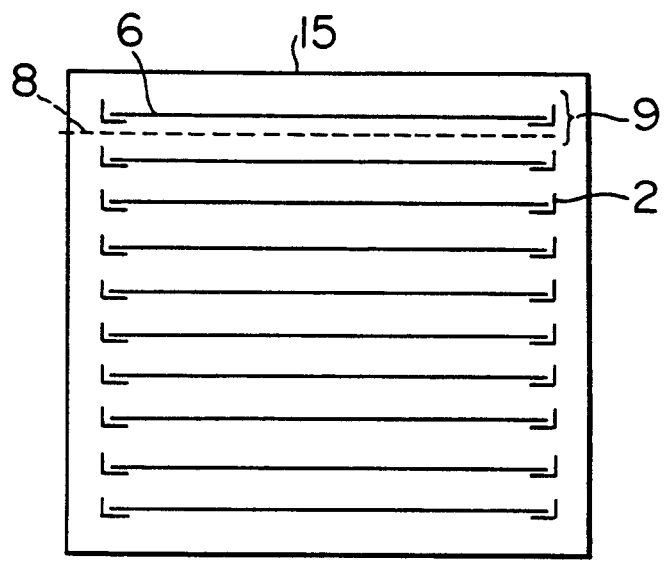
FIG. 2 is a schematic front view of a burn-in board carrier in which burn-in boards having different sizes are accommodated.
Figure 3:
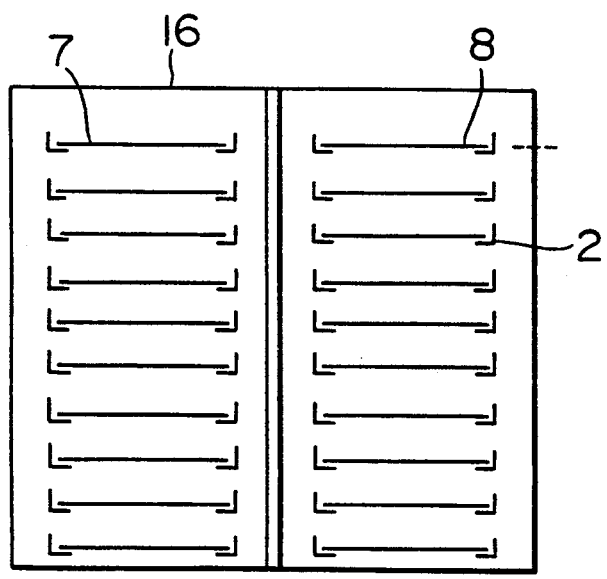
FIG. 3 is a schematic front view of a burn-in board carrier in which burn-in boards having different sizes are accommodated.
Figure 4:
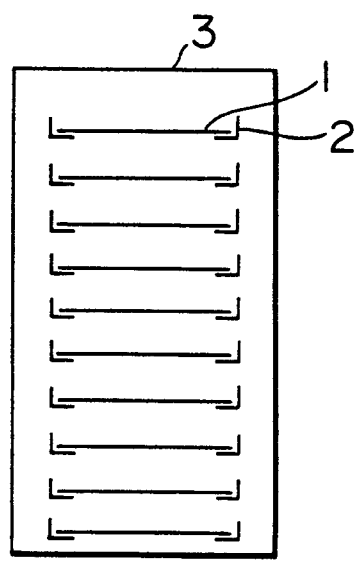
FIG. 4 is a schematic front view showing the state in which burn-in boards are inserted into the carrier of the conventional burn-in device.
Figure 5:
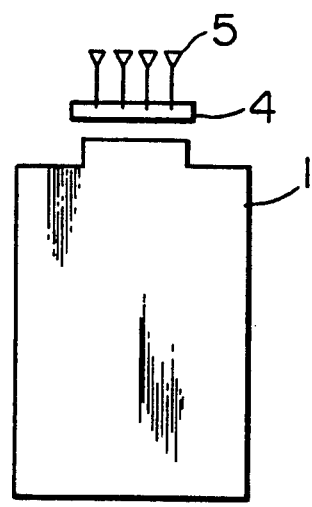
FIG. 5 is a schematic plan view showing how the burn-in boards of the device shown in FIG. 4 are connected.

FIG. 1 is a schematic plan view showing the state in which burn-in boards are inserted into a burn-in device in accordance with an embodiment of the present invention. FIGS. 2 and 3 are each a schematic front view of a burn-in board carrier in which burn-in boards having different sizes are accommodated. In these drawings, support members 2 are identical with those in the above conventional burn-in device.

A description will be given of a device with which a burn-in test can be conducted when three types of burn-in boards are used: large burn-in boards 6, each having a pair of connectors 10; small burn-in boards 7, each having a connector 11; and also small burn-in boards 8, each having a connector 12. The shape of the connector varies according to the number of pins, the pitch of a pin, the external dimensions, the arrangement of signals, etc.

Unit stages, slots 9, are each composed of two stages. The connectors 10, corresponding to the burn-in board 6, are arranged in a row on the upper stage, whereas connectors 11 and 12, respectively corresponding to the burn-in boards 7 and 8, are each arranged in a row on the lower stage. In each of the slots 9, one connector 10 on the upper stage is connected via signal lines 13 to the connector 11 on the lower stage, while at the same time the other connector 10 on the upper stage is also connected via the signal lines 13 to the connector 12 on the lower stage. Moreover, the signal lines 13 are connected to drivers 14.

In a burn-in device constructed as above, as shown in FIG. 2, a carrier 15, for the large burn-in boards, houses the large burn-in boards 6 in a column, whereas a carrier 16, for the small burn-in boards, houses the small burn-in boards 7 and 8 in two columns. The external dimensions of these carriers 15 and 16 are the same. The burn-in board 6 is accommodated in a position of the carrier 15 which is unevenly parallel to the positions of the carrier 16 in which the burn-in boards 7 and 8 are accommodated so that the burn-in board 6 may be inserted into the position which corresponds to the connectors 10 on the upper stage of each slot 9, and the burn-in boards 7 and 8 may be inserted into the positions which correspond to the connectors 11 and 12 on the lower stage of each slot 9. When a burn-in test is conducted for the large burn-in boards 6, the carrier 15, for the large burn-in boards, is inserted into an unillustrated burn-in chamber. The burn-in boards 6 are then connected to the connectors 10 on the upper stages. On the contrary, when a burn-in test is performed for the small burn-in boards 7 and 8, the carrier 16, for the small burn-in boards, is inserted into the burn-in chamber. The small burn-in boards 7 and 8 are then connected to the connectors 11 and 12 on the lower stages. During the burn-in test for the small burn-in boards 7 and 8, the carrier 15, for the large burn-in boards, is not used. Thus, a burn-in test can be carried out for three types of burn-in boards 6-8 with only a single burn-in device. This can be accomplished by selectively employing, in accordance with the burn-in boards 6-8 to be tested, the connectors 10 on the upper stage and the connectors 11 and 12 on the lower stage.

In the above embodiment, though each slot 9 is composed of an upper stage and a lower stage, and three types of connectors 10-12 are employed, more stages as well as types of connectors may be employed for each slot 9. Even if the number of stages and the types of connectors increase, a burn-in test for many kinds of burn-in boards can be conducted with the same burn-in test device. Furthermore, although the burn-in boards 7 and 8 are accommodated in two rows in the carrier 16, for the small burn-in boards, burn-in boards may also be accommodated in three or more rows in the carrier. A burn-in test can be nevertheless performed at the same time. In such a case, it is necessary to provide connectors in an amount which corresponds to the number of rows.

What is claimed is:

1. A burn-in device comprising:
   a burn-in board carrier having a plurality of slots arranged in columns, each slot comprising an upper and lower portion;
   a burn-in board of a first size installed in the upper portion of each slot;
   a burn-in board of a second size installed in the lower portion of each slot;
   first connectors arranged in a row along the upper portion of each slot and second and third connectors arranged in a row along the lower portion of each slot;
   signal lines corresponding to each slot connecting one of said first connectors to one of said second connectors and connecting another of said first connectors to one of said third connectors; and
   a driver connected to each signal line for generating an electrical signal for said connectors.

2. A burn-in device as claimed in claim 1 wherein the first burn-in board size is different from the second burn-in board size.

* * * * *